(12) United States Patent
Wu et al.

(10) Patent No.: US 12,112,930 B2
(45) Date of Patent: Oct. 8, 2024

(54) METHOD FOR IMPROVING DEPOSITION PROCESS

(71) Applicant: Taiwan Semiconductor Manufacturing Company, Ltd., Hsinchu (TW)

(72) Inventors: Jung-Tang Wu, Kaohsiung (TW); Szu-Hua Wu, Zhubei (TW); Chin-Szu Lee, Taoyuan (TW); Yi-Lin Wang, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 979 days.

(21) Appl. No.: 16/528,781

(22) Filed: Aug. 1, 2019

(65) Prior Publication Data

US 2020/0075299 A1 Mar. 5, 2020

Related U.S. Application Data

(60) Provisional application No. 62/726,020, filed on Aug. 31, 2018.

(51) Int. Cl.
| | | |
|---|---|---|
| H01J 37/34 | (2006.01) | |
| C23C 14/16 | (2006.01) | |
| C23C 14/34 | (2006.01) | |
| H01J 37/32 | (2006.01) | |
| H01L 21/285 | (2006.01) | |
| H10N 50/01 | (2023.01) | |

(52) U.S. Cl.
CPC ........ *H01J 37/3476* (2013.01); *C23C 14/165* (2013.01); *C23C 14/34* (2013.01); *C23C 14/3457* (2013.01); *H01J 37/3244* (2013.01); *H01J 37/3426* (2013.01); *H01L 21/2855* (2013.01); *H10N 50/01* (2023.02); *H01J 2237/327* (2013.01)

(58) Field of Classification Search
None
See application file for complete search history.

(56) References Cited

U.S. PATENT DOCUMENTS

| | | | | |
|---|---|---|---|---|
| 4,874,273 | A * | 10/1989 | Tokisue | ................. B65G 51/03 406/88 |
| 5,578,532 | A * | 11/1996 | van de Ven | ....... C23C 16/45519 438/584 |
| 6,090,709 | A | 7/2000 | Kaloyeros et al. | |
| 6,465,348 | B1 | 10/2002 | Wang | |
| 7,601,224 | B2 * | 10/2009 | Foree | .................. C23C 16/4584 118/724 |
| 9,399,812 | B2 | 7/2016 | Bodke et al. | |
| 2004/0211661 | A1 * | 10/2004 | Zhang | .................... C23C 14/345 204/192.12 |
| 2006/0030151 | A1 | 2/2006 | Ding et al. | |
| 2006/0254717 | A1 * | 11/2006 | Kobayashi | ........ H01L 21/68742 156/345.44 |
| 2009/0242385 | A1 | 10/2009 | Robison et al. | |

(Continued)

*Primary Examiner* — Jason Berman
(74) *Attorney, Agent, or Firm* — Slater Matsil, LLP

(57) ABSTRACT

A method includes placing a wafer on a wafer holder, depositing a film on a front surface of the wafer, and blowing a gas through ports in a redistributor onto a back surface of the wafer at a same time the deposition is performed. The gas is selected from a group consisting of nitrogen ($N_2$), He, Ne, and combinations thereof.

20 Claims, 15 Drawing Sheets

(56) References Cited

U.S. PATENT DOCUMENTS

| | | | |
|---|---|---|---|
| 2012/0135273 A1* | 5/2012 | Horng | H01F 10/3295 |
| | | | 428/828.1 |
| 2015/0092481 A1* | 4/2015 | Lee | H01L 21/28141 |
| | | | 365/158 |
| 2016/0079057 A1 | 3/2016 | Varadarajan et al. | |

* cited by examiner

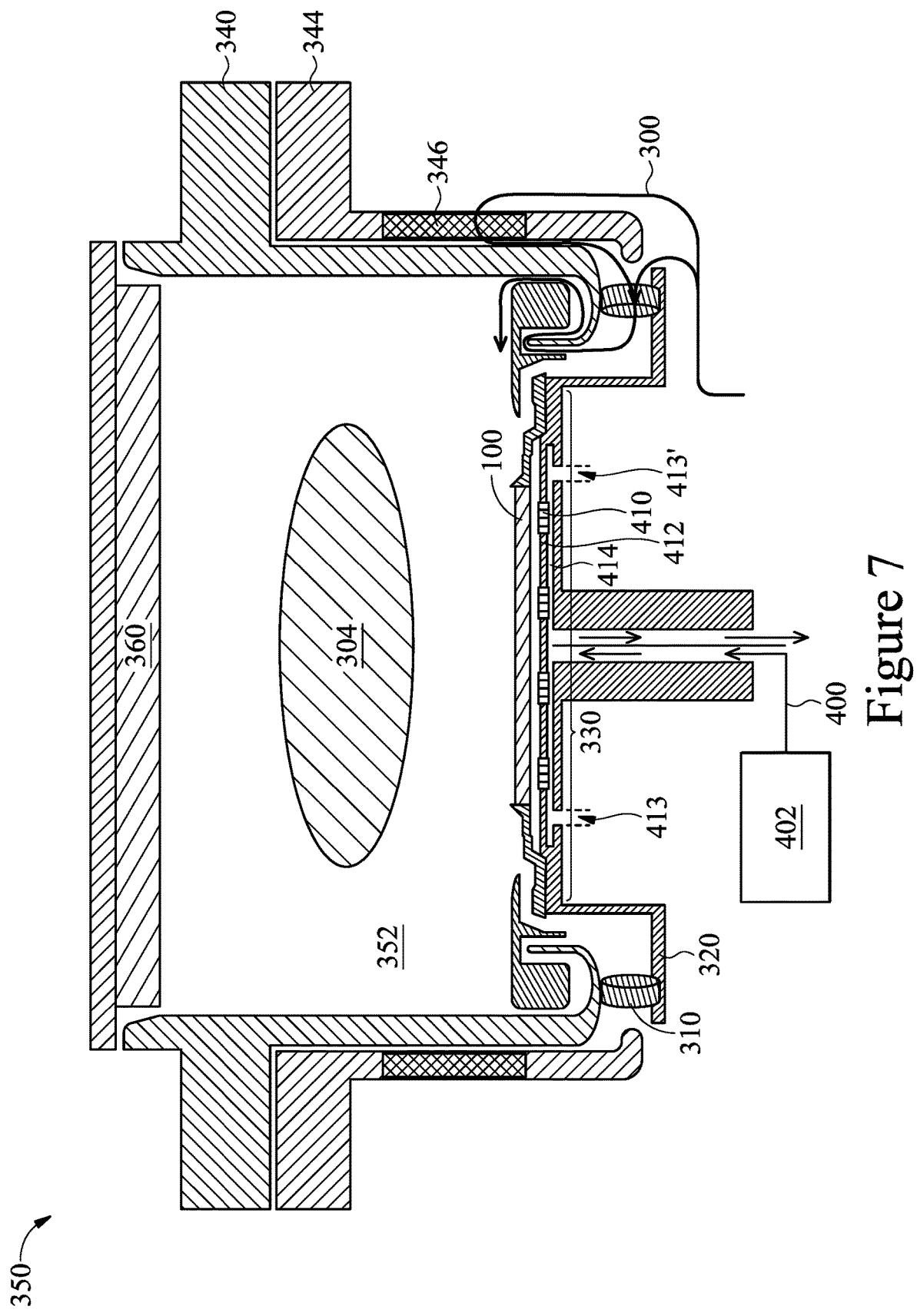

METHOD FOR IMPROVING DEPOSITION PROCESS

PRIORITY CLAIM AND CROSS-REFERENCE

This application claims the benefit of U.S. Provisional Application No. 62/726,020, filed on Aug. 31, 2018, entitled "Methods for Forming Thin Films, Including TiN Films, and Resulting Structures," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to increase the density of electronic components (e.g., transistors, diodes, resistors, capacitors, etc.) in integrated circuits (ICs) by innovations in semiconductor technology such as, progressive reductions in minimum feature size, three-dimensional (3D) transistor structures (e.g., the fin field-effect transistor (FinFET)), increasing the number of interconnect levels, and non-semiconductor memory, such as ferroelectric random access memory (RAM) or FRAM, and magneto-resistive RAM or MRAM, within the interconnect levels stacked above the semiconductor substrate. The basic storage element of an MRAM is the magnetic-tunnel-junction (MTJ). A high component density enables the System-on-Chip (SoC) concept wherein multiple functional blocks, such as, central processing unit (CPU), cache memory (e.g., static RAM (SRAM)), analog/RF functions, and nonvolatile memory (e.g., Flash, FRAM, and MRAM) are integrated on a single integrated circuit, often referred to as a chip. Integrating such a diversity of functions on one chip often presents new challenges in forming and integrating a concomitantly large variety of electronic components and transistor structures.

Physical Vapor Deposition (PVD) and Chemical Vapor Deposition (CVD) are widely used for deposition processes of the layers used in the formation of integrated circuits. In a PVD process or a CVD process, a wafer is typically placed in a vacuum chamber, and placed on an electronic chuck. When a PVD process is performed, a target is further placed over the wafer. Process gases are introduced into the vacuum chamber. The PVD process or the CVD process may be accompanied by the generation of plasma.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 illustrates a cross-sectional view of a vacuum chamber, in which a PVD or CVD process is performed.

DETAILED DESCRIPTION

Figure 1:
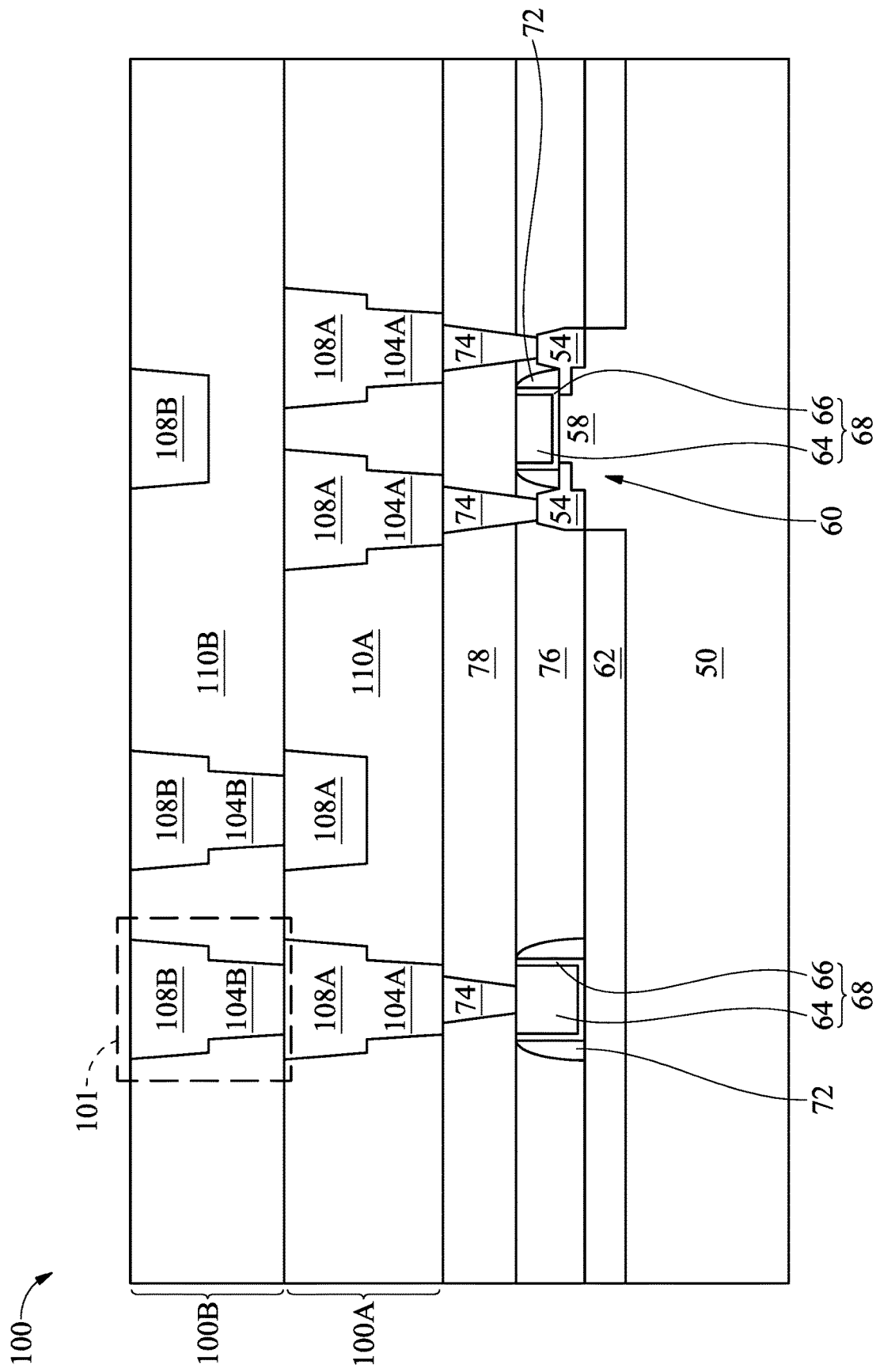
FIG. 1 illustrates a cross-sectional view of a semiconductor substrate and multilevel interconnect structures of an integrated circuit, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure describes embodiments of methods to deposit, e.g., conductive films in the context of forming magnetic tunnel junction (MTJ) memory cells in an MRAM array. The MTJ memory cell may be formed within, for example, a multilevel interconnect system comprising conductive interconnect structures of conductive lines, contacts, and vias used to connect electronic devices in an integrated circuit. The conductive interconnect structures may be formed in dielectric layers deposited over a semiconductor substrate in which multiple electronic devices may be formed, such as, fin field effect transistors (FinFETs), metal-oxide-semiconductor (MOS) capacitors, resistors, and the like, in accordance with some embodiments. These electronic devices may be used as components of integrated electronic circuitry by connecting external electrical power supplies and electrical signals to the electrodes of the electronic devices, and by interconnecting the electronic devices in accordance with the integrated circuit design using the multilevel interconnect system. In some embodiments, additional electronic devices may be formed above the semiconductor substrate. Examples of electronic devices formed above a semiconductor substrate include metal-insulator-metal (MIM) capacitors, thin-film resistors, metal inductors, micro-electro-mechanical system (MEMS) components (e.g., digital mirror devices, infrared bolometer arrays, inkjet print heads, etc.), and the like. Connections to electrodes of electronic devices formed above a substrate may also be established with conductive connectors and lines of the upper levels of the interconnect system.

The present disclosure includes methods of forming a conductive layer, for example, a bottom electrode (BE) of MTJ memory cells of an MRAM array. The BE refers to a conductive element used to electrically contact a lowermost layer of an MTJ which may be a storage element of a cell in an MRAM array. Advantageous features of the present disclosure's embodiments include reducing the arcing caused by high-voltage breakdown of the process gases, which may occur at the wafer edge regions, by blowing $N_2$, He, Ne or the like gases to the back surface of wafer in PVD or CVD processes. The arcing may cause undesirable balls (such as the metal to be deposited) to be generated on wafers. By using the embodiments of the present disclosure, this defect is reduced or avoided. While the present disclosure discusses aspects of methods of forming a conductive element in the context of forming a bottom electrode of an MTJ memory cell, other embodiments may utilize aspects of this disclosure with other semiconductor fabrication processes such as, for example, Magnetic Random Access Memory (MARM) and Back End of Line (BEOL) processes.

FIG. 1 illustrates a cross-sectional view of a semiconductor structure 100 comprising a semiconductor substrate 50 in which various electronic devices may be formed, and a portion of a multilevel interconnect system (e.g., layers 100A and 100B) formed over the substrate 50, in accordance with some embodiments. Generally, as will be discussed in greater detail below, FIG. 1 illustrates a FinFET device 60 formed on a substrate 50, with multiple interconnection layers formed thereover. FIG. 1 illustrates two interconnect layers (e.g., layers 100A and 100B) for illustrative purposes. In other embodiments, more or fewer interconnection layers may be formed at the illustrated point in the process.

Generally, the substrate 50 illustrated in FIG. 1 may comprise a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally comprise the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

The FinFET device 60 illustrated in FIG. 1 is a three-dimensional MOSFET structure formed in fin-like strips of semiconductor protrusions 58 referred to as fins. The cross-section shown in FIG. 1 is taken along a longitudinal axis of the fin in a direction parallel to the direction of the current flow between the source and drain regions 54. The fin 58 may be formed by patterning the substrate using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 58 by etching a trench into the substrate 50 using, for example, reactive ion etching (RIE). FIG. 1 illustrates a single fin 58, although the substrate 50 may comprise any number of fins.

Shallow trench isolation (STI) regions 62 formed along opposing sidewalls of the fin 58 are illustrated in FIG. 1. STI regions 62 may be formed by depositing one or more dielectric materials (e.g., silicon oxide) to completely fill the trenches around the fins and then recessing the top surface of the dielectric materials. The dielectric materials of the STI regions 62 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 62 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 62 such that an upper portion of fins 58 protrudes from surrounding insulating STI regions 62. In some cases, the patterned hard mask used to form the fins 58 may also be removed by the planarization process.

In some embodiments, the gate structure 68 of the FinFET device 60 illustrated in FIG. 1 is a high-k, metal gate (HKMG) gate structure that may be formed using a gate-last process flow. In a gate last process flow a sacrificial dummy gate structure (not shown) is formed after forming the STI regions 62. The dummy gate structure may comprise a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins and extend between the fins over the surface of the STI regions 62. As described in greater detail below, the dummy gate structure may be replaced by the HKMG gate structure 68 as illustrated in FIG. 1. The HKMG gate structure 68 illustrated in the right side in FIG. 1 (seen on the top of fin 58) is an example of an active HKMG gate structure which extends, e.g., along sidewalls of and over a portion of fin 58 protruding above the STI 62, and the HKMG gate structure 68 in the left side in FIG. 1 is an example gate structure extending over the STI region 62, such as between adjacent fins. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Source and drain regions 54 and spacers 72 of FinFET 60, illustrated in FIG. 1, are formed, for example, self-aligned to the dummy gate structures. Spacers 72 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 72 along the sidewalls of the dummy gate structures extending laterally onto a portion of the surface of the fin (as illustrated in the right side of FIG. 1) or the surface of the STI dielectric (as illustrated in the left side of FIG. 1).

Source and drain regions 54 are semiconductor regions in direct contact with the semiconductor fin 58. In some embodiments, the source and drain regions 54 may comprise heavily-doped regions and relatively lightly-doped drain extensions, or LDD regions. Generally, the heavily-doped regions are spaced away from the dummy gate structures using the spacers 72, whereas the LDD regions may be formed prior to forming spacers 72 and, hence, extend under the spacers 72 and, in some embodiments, extend further into a portion of the semiconductor below the dummy gate structure. The LDD regions may be formed, for example, by implanting dopants (e.g., As, P, B, In, or the like) using an ion implantation process.

The source and drain regions 54 may comprise an epitaxially grown region. For example, after forming the LDD regions, the spacers 72 may be formed and, subsequently, the heavily-doped source and drain regions may be formed self-aligned to the spacers 72 by first etching the fins to form recesses, and then depositing a crystalline semiconductor material in the recess by a selective epitaxial growth (SEG) process that may fill the recess and, typically, extend beyond the original surface of the fin to form a raised source-drain structure, as illustrated in FIG. 1. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as, e.g. vapor/solid/liquid phase epitaxy (VPE, SPE, LPE), or metal-organic CVD (MOCVD), or molecular beam epitaxy (MBE), or the like. A high dose (e.g., from about $10^{14}$ $cm^{-2}$ to $10^{16}$ $cm^{-2}$) of dopants may be introduced into the heavily-doped source and drain regions 54 either in situ during SEG, or by an ion implantation process performed after the SEG, or by a combination thereof.

A first interlayer dielectric (ILD) 76 (seen in FIG. 1) is deposited over the structure. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD 76.

The HKMG gate structures 68, illustrated in FIG. 1, may then be formed by first removing the dummy gate structures using one or more etching techniques, thereby creating recesses between respective spacers 72. Next, a replacement gate dielectric layer 66 comprising one more dielectrics, followed by a replacement conductive gate layer 64 comprising one or more conductive materials, are deposited to completely fill the recesses. Excess portions of the gate structure layers 64 and 66 may be removed from over the top surface of first ILD 76 using, for example a CMP process. The resulting structure, as illustrated in FIG. 1, may be a substantially coplanar surface comprising an exposed top surface of first ILD 76, spacers 72, and remaining portions of the HKMG gate layers 66 and 64 inlaid between respective spacers 72.

The gate dielectric layer 66 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the conductive gate layer 64 may be a multilayered metal gate stack comprising a barrier layer, a work function layer, and a gate-fill layer formed successively on top of gate dielectric layer 66. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may comprise metals such as Cu, Al, W, Co, Ru, or the like, or combinations thereof, or multi-layers thereof. The materials used in forming the gate structure may be deposited by any suitable method, e.g., CVD, PECVD, PVD, ALD, PEALD, electrochemical plating (ECP), electroless plating and/or the like.

A second ILD layer 78 may be deposited over the first ILD layer 76, as illustrated in FIG. 1. In some embodiments, the insulating materials to form the first ILD layer 76 and the second ILD layer 78 may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD layer 76 and the second ILD layer 78 may be deposited using any suitable method, such as CVD, physical vapor deposition (PVD), ALD, PEALD, PECVD, SACVD, FCVD, spin-on, and/or the like, or a combination thereof.

As illustrated in FIG. 1, electrodes of electronic devices formed in the substrate 50 may be electrically connected to conductive features of a first interconnect level 100A using conductive connectors (e.g., contacts 74) formed through the intervening dielectric layers. In the example illustrated in FIG. 1, the contacts 74 make electrical connections to the source and drain regions 54 of FinFET 60. Contacts 74 to gate electrodes are typically formed over STI regions 62. A separate gate electrode 64 (shown in the left in FIG. 1) illustrates such contacts. The contacts may be formed using photolithography techniques. For example, a patterned mask may be formed over the second ILD 78 and used to etch openings that extend through the second ILD 78 to expose a portion of gate electrodes over STI regions 62, as well as etch openings over the fins 58 that extend further, through the first ILD 76 and the CESL (not shown) liner below first ILD 76 to expose portions of the source and drain regions 54. In some embodiments, an anisotropic dry etch process may be used wherein the etching is performed in two successive steps. The etchants used in the first step of the etch process have a higher etch rate for the materials of the first and second ILD layers 76 and 78 relative to the etch rate for the materials used in the gate electrodes 64 and the CESL, which may be lining the top surface of the heavily-doped regions of the source and drain regions 54. Once the first step of the etch process exposes the CESL, the second step of the etch process may be performed wherein the etchants may be switched to selectively remove the CESL.

In some embodiments, a conductive liner may be formed in the openings in the first ILD layer 76 and the second ILD layer 78. Subsequently, the openings are filled with a conductive fill material. The liner comprises barrier metals used to reduce out-diffusion of conductive materials from the contacts 74 into the surrounding dielectric materials. In some embodiments, the liner may comprise two barrier metal layers. The first barrier metal comes in contact with the semiconductor material in the source and drain regions 54 and may be subsequently chemically reacted with the heavily-doped semiconductor in the source and drain regions 54 to form a low resistance ohmic contact, after which the reacted metal may be removed. For example, if the heavily-doped semiconductor in the source and drain regions 54 is silicon or silicon-germanium alloy semiconductor, then the first barrier metal may comprise Ti, Ni, Pt, Co, other suitable metals, or their alloys. The second barrier metal layer of the conductive liner may additionally include other metals (e.g., TiN, TaN, Ta, or other suitable metals, or their alloys). A conductive fill material (e.g., W, Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the second ILD 78. The resulting conductive plugs extend into the first and second ILD layers 76 and 78 and constitute contacts 74 making physical and electrical connections to the electrodes of electronic devices, such as the tri-gate FinFET 60 illustrated in FIG. 1. In this example, contacts to electrodes over STI 62 and to electrodes over fins 58 are formed simultaneously using the same processing steps. However, in other embodiments these two types of contacts may be formed separately.

As illustrated in FIG. 1, multiple interconnect levels may be formed, stacked vertically above the contact plugs 74 formed in the first and second ILD layers 76 and 78, in accordance with a back end of line (BEOL) scheme adopted for the integrated circuit design. In the BEOL scheme illustrated in FIG. 1, various interconnect levels have similar features. However, it is understood that other embodiments may utilize alternate integration schemes wherein the various interconnect levels may use different features. For example, the contacts 74, which are shown as vertical connectors, may be extended to form conductive lines which transport current laterally.

In this disclosure, the example interconnect level comprises conductive vias and lines embedded in an intermetal dielectric (IMD) layer. In addition to providing insulation between various conductive elements, an IMD layer may include one or more dielectric etch stop layers to control the etching processes that form openings in the IMD layer. Generally, vias conduct current vertically and are used to electrically connect two conductive features located at vertically adjacent levels, whereas lines conduct current laterally and are used to distribute electrical signals and power within one level. In the BEOL scheme illustrated in FIG. 1, conductive vias 104A connect contacts 74 to conductive lines 108A and, at subsequent levels, vias connect lower lines to upper lines (e.g., a pair of lines 108A and 108B can be connected by via 104B). Other embodiments may adopt a different scheme. For example, vias 104A may be omitted from the example level and the contacts 74 may be configured to be directly connected to lines 108A.

Still referring to FIG. 1, the first interconnect level 100A may be formed using, for example, a dual damascene process flow. First, a dielectric stack used to form IMD layer 110A may be deposited using one or more layers of the dielectric materials listed in the description of the first and second ILD layers 76 and 78. In some embodiments, IMD layer 110A includes an etch stop layer (not shown) positioned at the bottom of the dielectric stack. The etch stop layer comprises one or more insulator layers (e.g., SiN, SiC, SiCN, SiCO, CN, combinations thereof, or the like) having an etch rate different than an etch rate of an overlying material. The techniques used to deposit the dielectric stack for IMD may be the same as those used in forming the first and second ILD layers 76 and 78.

Appropriate photolithography and etching techniques (e.g., anisotropic RIE employing fluorocarbon chemistry) may be used to pattern the IMD layer 110A to form openings for vias and lines. The openings for vias may be vertical holes extending through IMD layer 110A to expose a top conductive surface of contacts 74, and openings for lines may be longitudinal trenches formed in an upper portion of the IMD layer 110A. In some embodiments, the method used to pattern holes and trenches in IMD layer 110A utilizes a via-first scheme, wherein a first photolithography and etch process form holes for vias, and a second photolithography and etch process form trenches for lines. Other embodiments may use a different method, for example, a trench-first scheme, or an incomplete via-first scheme, or a buried etch stop layer scheme. The etching techniques may utilize multiple steps. For example, a first main etch step may remove a portion of the dielectric material of IMD layer 110A and stop on an etch stop dielectric layer. Then, the etchants may be switched to remove the etch stop layer dielectric materials. The parameters of the various etch steps (e.g., chemical composition, flow rate, and pressure of the gases, reactor power, etc.) may be tuned to produce tapered sidewall profiles with a desired interior taper angle.

Several conductive materials may be deposited to fill the holes and trenches forming the conductive features 104A and 108A of the first interconnect level 100A. The openings may be first lined with a conductive diffusion barrier material and then completely filled with a conductive fill material deposited over the conductive diffusion barrier liner. In some embodiments, a thin conductive seed layer may be deposited over the conductive diffusion barrier liner to help initiate an electrochemical plating (ECP) deposition step that completely fills the openings with a conductive fill material.

The diffusion barrier conductive liner in the vias 104A and lines 108A comprises one or more layers of TaN, Ta, TiN, Ti, Co, or the like, or combinations thereof. The conductive fill layer in 104A and 108A may comprise metals such as Cu, Al, W, Co, Ru, or the like, or combinations thereof, or multi-layers thereof. The conductive materials used in forming the conductive features 104A and 108A may be deposited by any suitable method, for example, CVD, PECVD, PVD, ALD, PEALD, ECP, electroless plating and the like. In some embodiments, the conductive seed layer may be of the same conductive material as the conductive fill layer and deposited using a suitable deposition technique (e.g., CVD, PECVD, ALD, PEALD, or PVD, or the like).

Any excess conductive material over the IMD layer 110A outside of the openings may be removed by a planarizing process (e.g., CMP) thereby forming a top surface comprising dielectric regions of IMD layer 110A that are substantially coplanar with conductive regions of conductive lines 108A (e.g., conductive lines in the example layer). The planarization step embeds the conductive vias 104A and conductive lines 108A into IMD layer 110A, as illustrated in FIG. 1.

The interconnect level positioned vertically above the first interconnect level 100A in FIG. 1, is the second interconnect level 100B. In some embodiments, the structures of the various interconnect levels (e.g., the first interconnect level 100A and the second interconnect level 100B) may be similar. In the example illustrated in FIG. 1, the second interconnect level 100B comprises conductive vias 104B and conductive lines 108B embedded in an insulating film IMD 110B having a planar top surface. The materials and processing techniques described above in the context of the first interconnect level 100A may be used to form the second interconnect level 100B and subsequent interconnect levels.

Although an example electronic device (FinFET 60) and example interconnect structures making connections to the electronic device are described, it is understood that one of ordinary skill in the art will appreciate that the above examples are provided for illustrative purposes only to further explain applications of the present invention, and are not meant to limit the present invention in any manner.

Figure 2:
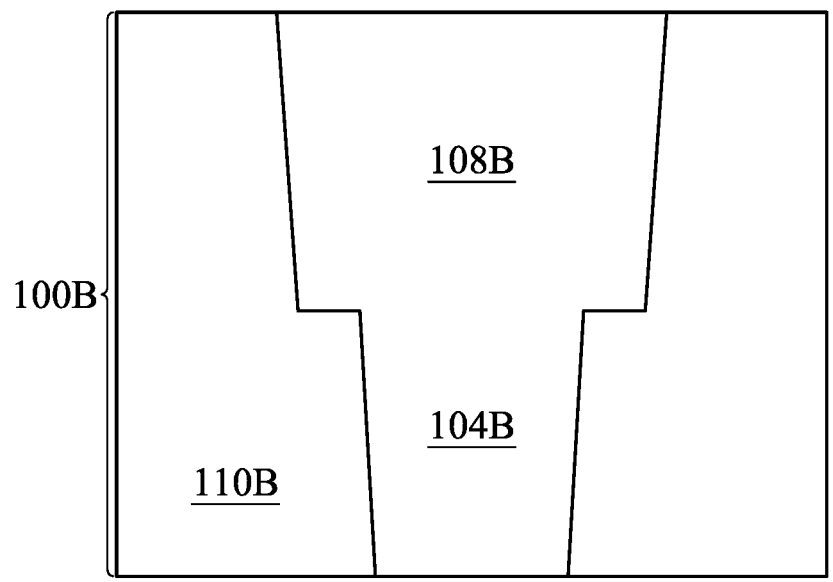
FIGS. 2 through 6 illustrate cross-sectional views of an MRAM cell using an MTJ storage element at various earlier stages of fabrication, in accordance with some embodiments.

FIG. 2 illustrates a detailed view of region 101 of FIG. 1, showing the second interconnect level 100B at an initial stage of fabrication of the MRAM cell. In FIG. 2, the conductive line 108B at the second interconnect level 100B has been illustrated as the conductive feature to which a bottom electrode (BE) of an MTJ memory cell will be electrically coupled at a subsequent processing step, in accordance with some embodiments. The conductive line 108B is shown for illustrative purposes only; it is understood that the BE and MTJ memory cell may be formed on a conductive line in any metallization layer suitable in a particular design. In FIG. 2, a via 104B and a conductive line 108B are shown embedded in an insulating film IMD 110B. The top dielectric surface of IMD 110B is shown to be substantially coplanar with the top conductive surface of conductive line 108B, within process variations.

Figure 3:
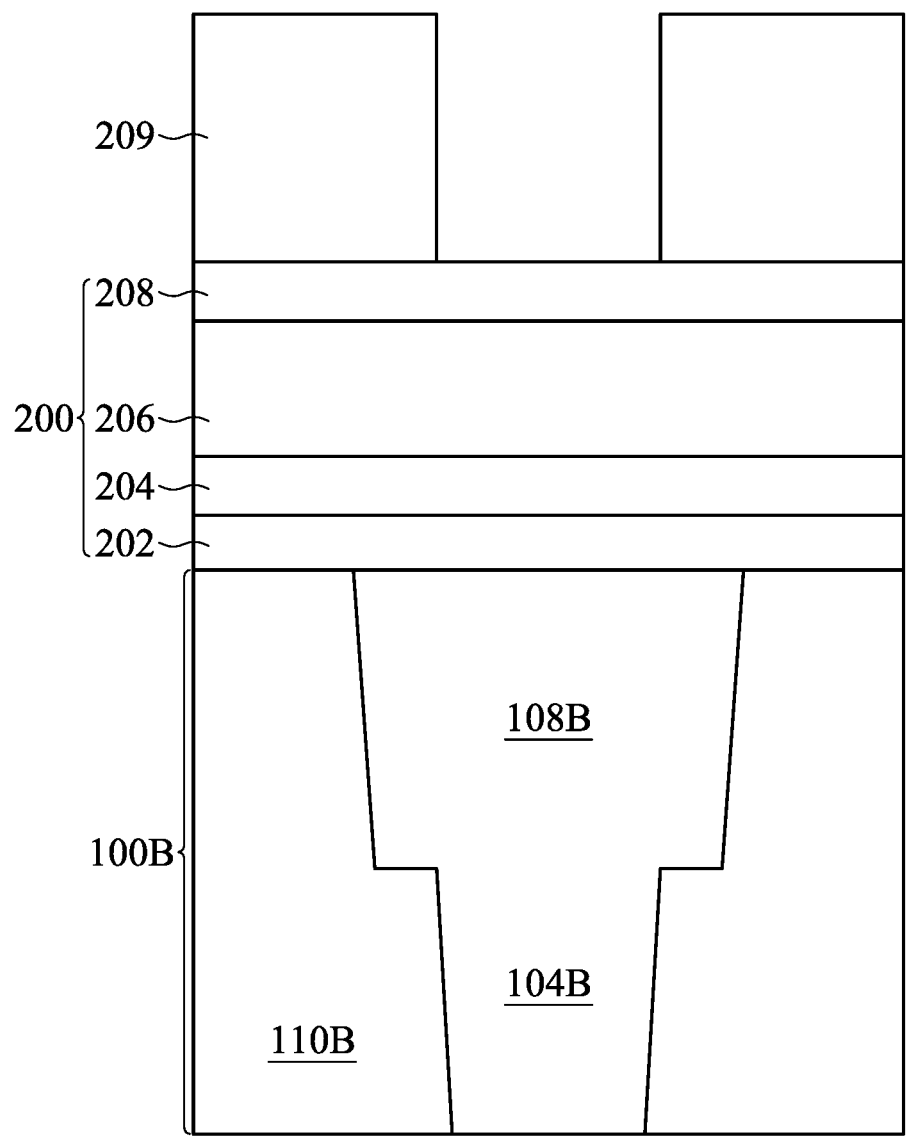

FIG. 3 illustrates a dielectric stack 200 comprising one or more dielectric layers formed successively over the interconnect level 100B in accordance with some embodiments. In some embodiments, the dielectric stack 200 may be positioned between a subsequently formed MRAM cell and the conductive line 108B. A first dielectric layer 202 may be formed over the planarized top surface of the interconnect level 100B, and a second dielectric layer 204 formed over first dielectric layer 202. In the example structure illustrated in FIG. 3, the first and second dielectric layers 202 and 204 may be used collectively as an etch stop layer during a subsequent etching step used to form vertical holes extending through the dielectric stack 200. In some embodiments, the first and second dielectric layers 202 and 204 comprise AlN and $AlO_x$, respectively, although other dielectric materials (e.g., SiN, SiC, and/or the like, or a combination thereof) may be used. In some embodiments, the first dielectric layer 202 may have a thickness from about 10 Å to about 1000 Å, and the second dielectric layer 204 may have a thickness from about 10 Å to about 1000 Å.

Still referring to FIG. 3, a third dielectric layer 206, formed over the second dielectric layer 204, provides insulation between conductive line 108B and the subsequently formed BE of an MTJ memory cell of an MRAM array. In this example, the third dielectric layer 206 may comprise a silicon oxide deposited using, for example, a CVD technique with tetraethyl orthosilicate (TEOS) as a precursor. Other embodiments may use other insulators, for example, PSG, BSG, BPSG, USG, FSG, SiOCH, CDO, flowable oxide, or porous oxides (e.g., xerogels/aerogels), or the like, or a combination thereof. In some embodiments, the third dielectric layer 206 may have a thickness from about 50 Å to about 1000 Å.

FIG. 3 further illustrates an anti-reflective coating (ARC) 208 overlying the third dielectric layer 206 of the example dielectric stack 200, and a patterned photoresist layer 209 overlying the ARC 208. Anti-reflective coatings improve photo resolution by reducing optical distortions associated with specular reflections, thin-film interference, and/or standing waves that may inhibit sharp feature definition during imaging of photoresist material. In the illustrated example, the ARC 208 may comprise a nitrogen-free ARC (NFARC) (e.g., an organic ARC, such as $C_xH_yO_x$, or inorganic ARC, such as SiC) to further improve feature definition during patterning of photoresist layer 209. In some embodiments, the ARC 208 may have a thickness from about 50 Å to about 1000 Å. The various dielectric layers of dielectric stack 200 may be formed by any suitable deposition technique, e.g., CVD, PECVD, ALD, PEALD, PVD, spin-on and/or the like, or a combination thereof. The structure of the dielectric stack 200 is provided as example only; other insulating structures may be utilized.

Figure 4:
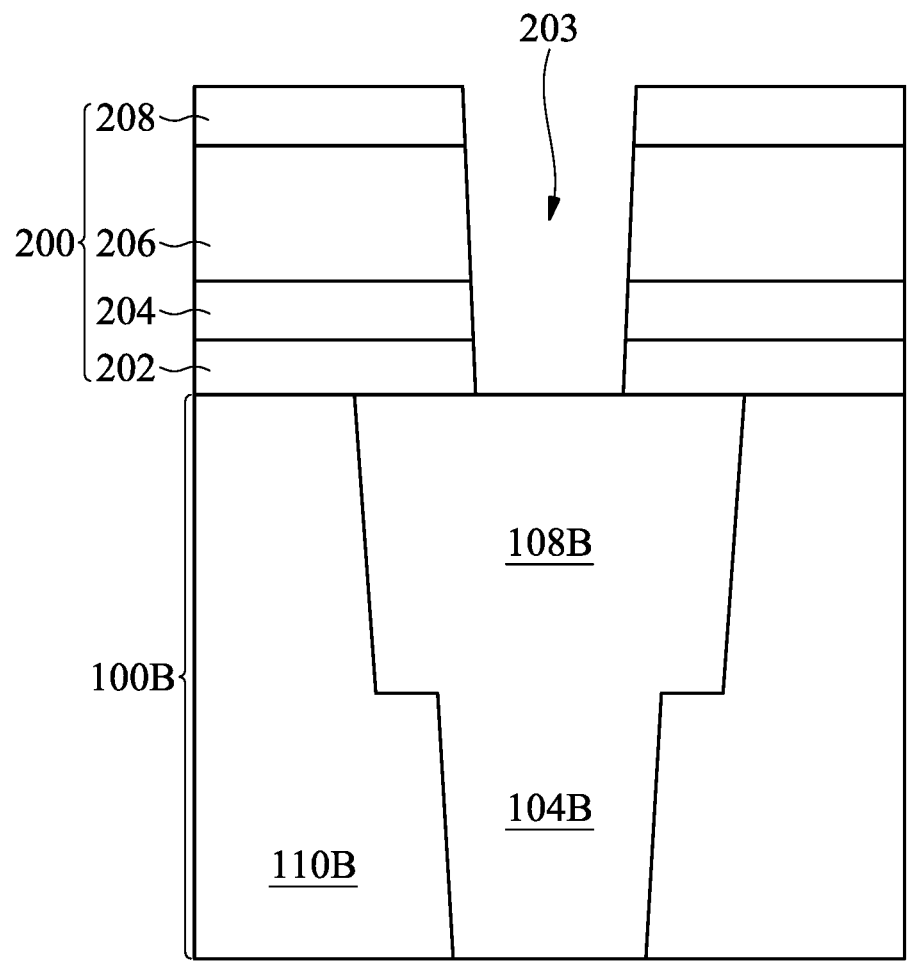

FIG. 4 illustrates a hole 203 extending through the dielectric stack 200 to expose a portion of the conductive top surface of the conductive line 108B inlaid in the insulating film IMD 110B. The dielectric stack 200 may be patterned using the patterned photoresist layer 209 as an etch mask to etch holes 203. Any acceptable etching technique may be used, for example, RIE processes described earlier with reference to FIG. 1 used to form vias and lines such as the via 104B and the conductive line 108B. The etching process may include one or more etching steps, for example, a first etch step may be performed using etchants to remove an exposed portion of the ARC layer 208, and a second etch step may be performed using etchants that remove the third dielectric layer 206 but leave the first and second dielectric layers 204 and 202 positioned below the third dielectric layer 206 relatively unetched. A third etch step may remove an exposed portion of the first and second dielectric layers 202 and 204 and expose a portion of the top conductive surface of conductive line 108B, as illustrated in FIG. 4. In some embodiments, the first and second etch steps may be the same step.

Figure 5:
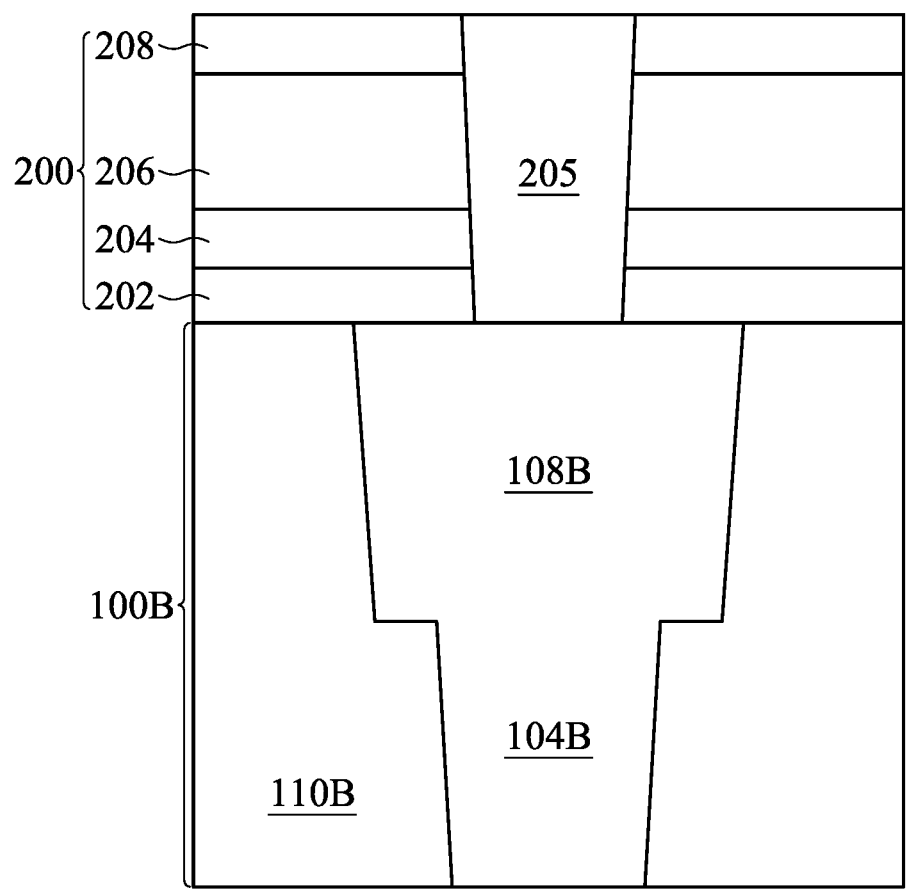

FIG. 5 illustrates a BE via 205 formed in the dielectric stack 200 and electrically connected to conductive line 108B. The BE via 205 may comprise one or more layers. For example, the hole 203 (see FIG. 4) may be filled with a conductive diffusion barrier liner and a conductive fill material filling the hole 203. A planarizing process (e.g., CMP) may be performed to remove excess conductive material from over the top surface of the dielectric stack 200 to form a dielectric surface that is substantially planar with the top conductive surface of the BE via 205, as illustrated in FIG. 5.

In some embodiments, (including the example illustrated in FIG. 5) the materials and processing techniques used to form the BE via 205 may be the same as those used to form vias at the interconnect levels described above (e.g., 104A and 104B). In other embodiments, the conductive materials and processes used to form BE via 205 may be different from the conductive materials and processes used to form the conductive features of the interconnect levels formed in prior, or subsequent, processing steps. For example, Cu may be used as the conductive fill material in 104A and 104B, while TiN may be used as the conductive fill material in BE via 205. In another embodiment, another conductive material such as Co may be used as the conductive fill material in BE via 205.

Figure 6:
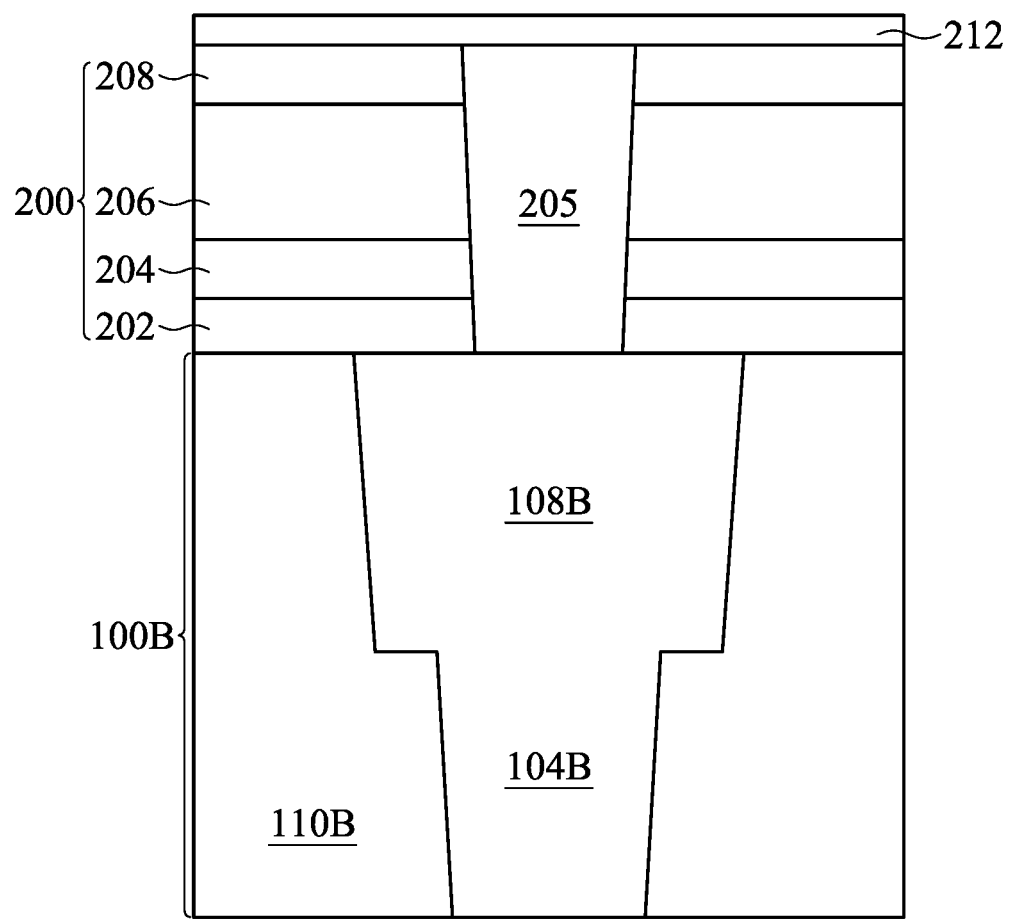

FIG. 6 illustrates a first conductive layer 212 comprising, for example, TaN being formed on the top surface of the dielectric stack 200 and the BE via 205, in accordance with some embodiments. As discussed in greater detail below, the first conductive layer 212 will form part of a bottom electrode layer 210. In other embodiments, the first conductive layer 212 may include either more or less than two conductive layers, and may use other conductive materials (e.g., Cu, Al, Ta, W, Ti, or the like). The first conductive layer 212 may be deposited using any suitable technique, such as CVD, ALD, PECVD, PEALD, or PVD, or the like, or a combination thereof. In some embodiments, the first conductive layer 212 may have a thickness from about 10 Å to about 500 Å.

FIG. 7 illustrates a cross-sectional view of an apparatus 350, in which a PVD or CVD process is performed to form the second conductive layer 214. The apparatus 350 may comprise a grounding strip 310, a grounding bracket 320, a wafer stage 330, a first shield 340, a second shield 344, and a target 360. The semiconductor structure 100 is disposed on the wafer stage 330 with the first conductive layer 212 exposed on its top surface. In some embodiments, the second conductive layer 214 is deposited using PVD with a process gas 300 excited to a plasma state 304 and used to bombard the target 360.

A backside gas 400 is blown onto the back side of semiconductor structure 100 through outlet ports 410 in gas redistributor 412 for the purpose of uniformly heating the semiconductor structure 100. In accordance with some embodiments, the temperature of the backside gas 400 is in a range between about 200° C. and about 450° C. The apparatus includes a source (storage) 402, which stores backside gas(es) 400 that is to be blown to the backside of the wafer. The backside gas provided in the storage is fed to the back surface of the semiconductor structure 100 as shown in FIG. 7. The backside gas 400 may leak around the edges of the semiconductor structure 100 into the process chamber 352. This leakage of the backside gas 400 can induce electrical arcing between the semiconductor structure 100 and the wafer stage 330. The electrical arcing can produce ball defects in the deposited layer, which are protrusions protruding higher than the top surface of surrounding portions of the deposited layer (such as layers 212 and 214). Because the breakdown voltage of $N_2$ is significantly higher than some other gases such as argon and $H_2$, using $N_2$ as the backside gas 400 may prevent electrical arcing and the formation of ball defects on the top surface of the deposited layer. In some embodiments, other backside gases such as He and/or Ne, which also have high breakdown voltages, may also be used.

The formation of the first conductive layer 212 may or may not suffer from ball defects. In accordance with some embodiments in which the formation of the first conductive layer 212 suffers from the ball defects, the backs side gas 400 include nitrogen and/or other gases with breakdown voltages higher than that of nitrogen such as Ne and He in any combination. The gases with relatively low breakdown voltages such as argon are not stored in storage 402, and are not used as backside gas 400. In accordance with other embodiments in which the formation of the first conductive layer 212 does not suffer from the ball defects, the respective backside gas 400 may include gases with high breakdown voltages and/or gases with low breakdown voltages. For example, the backside gas 400 may include Ar, $N_2$, Ne, He, or combinations thereof.

In accordance with some embodiments, as shown in FIG. 7, there is an inlet and an outlet leading to the space 414, which inlet and outlet are shown as having backside gas 400 flowing into and out of space 414, respectively. In accordance with some embodiments, the inlet and the outlet are both close to the center axis of the wafer, as illustrated in FIG. 7. In accordance with alternative embodiments, the inlet and outlet of the backside gas 400 are located close to the edges of space 414, and the inlet and the outlet are illustrated as 413 and 413', respectively.

In accordance with some embodiments, when the first conductive layer 212 is deposited, the backside gas 400 has a flow rate in a range between about 10 sccm and about 500 sccm. The pressure in space 414 may be in the range between about 0.5 mTorr and about 4 Torr, or in the range between about 0.2 mTorr and about 10 Torr.

The process gas 300 is introduced into the process chamber 352, and may be excited into the plasma state 304 and used to sputter metal atoms from the overlying target 360. The process gas 300 may be $N_2$, Ar, $H_2$, Ne, or combinations thereof. The process gas 300 may be introduced into the process chamber 352 by being passed through a window 346 in the second shield 344 and through the grounding strip 310. In some embodiments, the process gas 300 used is the same as the backside gas 400. In other embodiments, the process gas 300 and the backside gas 400 may comprise different gases. The target 360 may be applied with a voltage lower than about 800 V during the formation of the second conductive layer 214. The DC power for the plasma generated from the process gas 300 may have a voltage between about 500 V to 900 V and a current between about 15 Å to about 25 Å. The DC power for the plasma 304 generated from the process gas 300 may be in a range from about 1 KW to about 30 KW. The formation of the second conductive layer 214 may include a pre-deposition phase in which the process chamber 352 is heated, a deposition phase, and a post-deposition phase in which the process chamber 352 is cooled. In some embodiments, the second conductive layer 214 may have a thickness from about 50 Å to about 2000 Å.

Figure 8A:
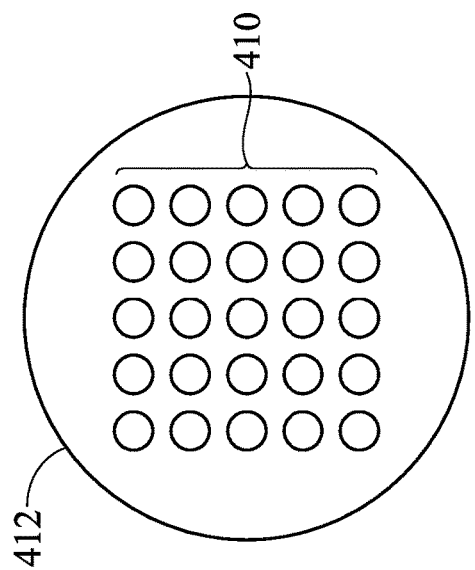
FIGS. 8a-d illustrate some outlet patterns for blowing a gas to a back surface of a wafer.
Figure 8B:
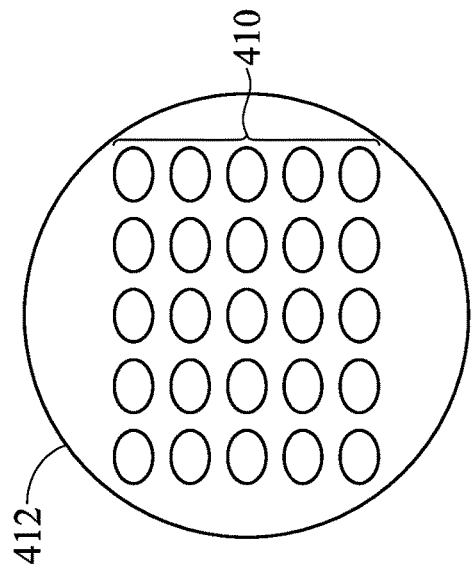
Figure 8C:
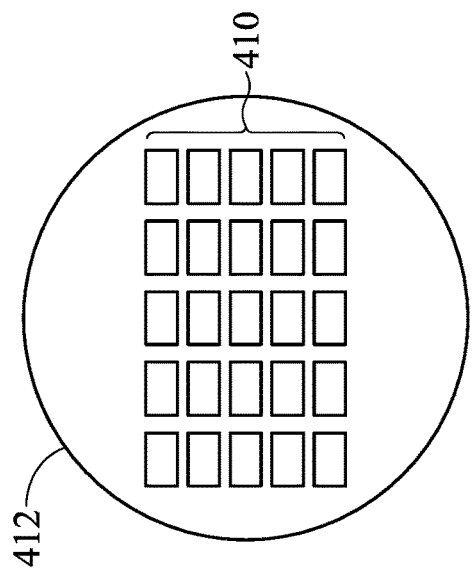
Figure 8D:
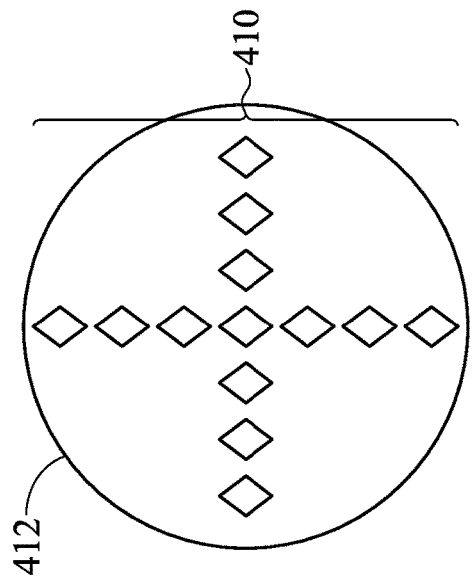

FIGS. 8a, 8b, 8c, and 8d illustrate various outlet patterns for outlet ports 410 for blowing the backside gas to the backs of wafers, wherein the circles represent the corresponding wafers. FIG. 8a illustrates an outlet pattern in which the distribution ports comprise circular shapes and are arranged in a grid pattern. FIG. 8b illustrates an outlet pattern in which the distribution ports comprise oblong (oval) shapes and are arranged in a grid pattern. FIG. 8c illustrates an outlet pattern in which the ports comprise rectangular shapes and are arranged in a grid pattern. FIG. 8d illustrates an outlet pattern in which the ports comprise rhombus shapes and are arranged in a cross pattern. In other embodiments, the ports may comprise rectangular and/or circular or oblong shapes and be arranged in a cross pattern, or the ports may comprise rhombus shapes and be arranged in a grid pattern, or the ports may comprise combinations of circular, oblong, rectangular, and/or rhombus shapes arranged in combinations of grid and cross patterns. The outlet ports may be distributed so that the number of ports along an x-axis is between 1 and 1000 and so that the number of ports along a y-axis is between 1 and 1000. The distances between edges of adjacent ports may be between about 1 mm to about 100 mm. The distances between center points of adjacent ports may be between about 1 mm to about 100 mm. These outlet patterns and port shapes may be applied to any PVD or CVD tool.

FIGS. 8a, 8b, 8c, and 8d are example layouts of outlet ports 410 in gas redistributor 412. As is shown in FIG. 7, the inlet and outlet of backside gas 400 may cause non-uniform distribution of the backside gas 400 blown to the backside of the wafer. Redistributor 412 is thus used to redistribute the gas flow. The sizes and the positions of outlet ports 410 are designed so that there is a uniform distribution of backside gas toward the backside of wafer. As a result, backside gas 400 may provide a uniform heating to the backside of the wafer. The uniform heating results in a uniform growth of the second conductive layer 214. In addition, the redistributor 412 may mitigate the gas flow, so that the backside gas 400 is not blown directly to the wafer. In accordance with some embodiments, the inlet and the outlet (as shown in FIG. 7) are offset from, and are not blown directly to outlet ports 410.

Figure 9:
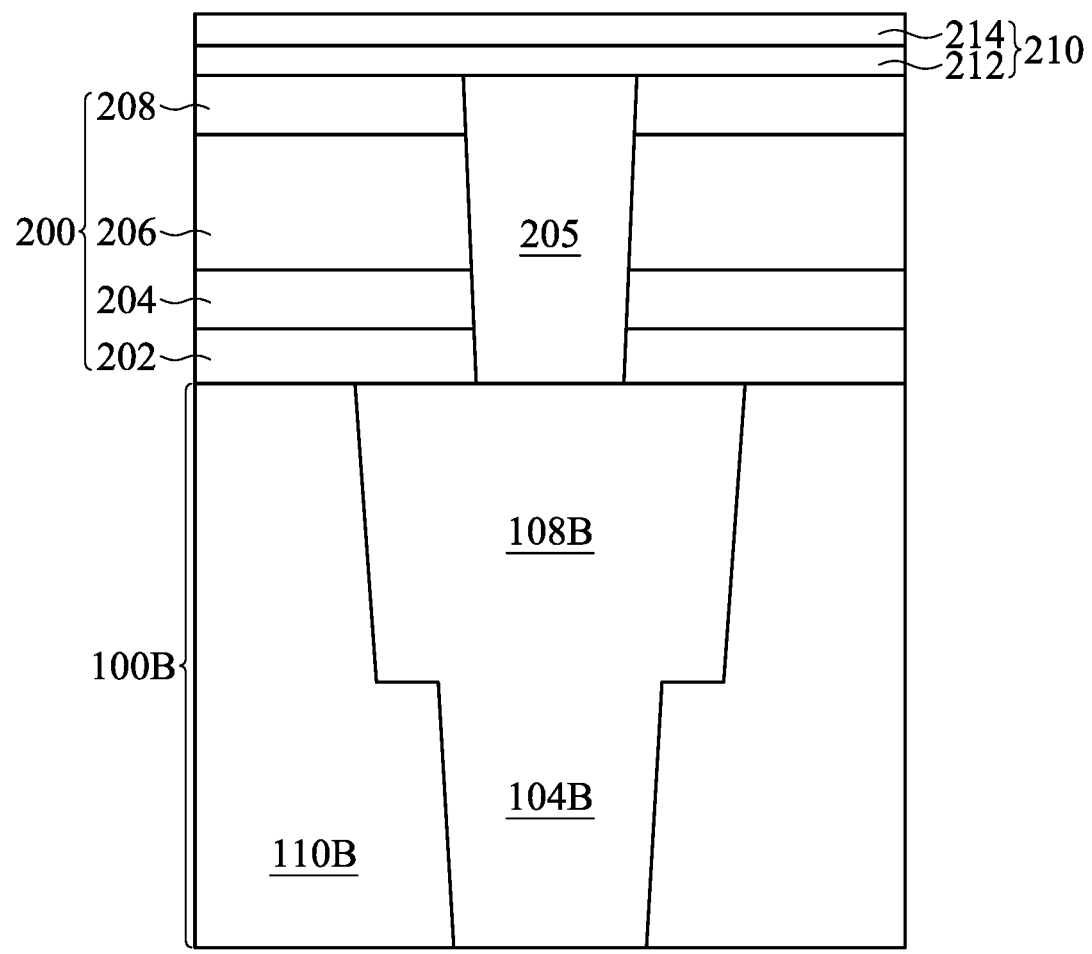
FIGS. 9 through 15 illustrate cross-sectional views of an MRAM cell using an MTJ storage element at various later stages of fabrication, in accordance with some embodiments.

FIG. 9 illustrates the formation of the second conductive layer 214 without ball defects by the usage of $N_2$/He/Ne as the backside gas 400 in the apparatus 350, in accordance with some embodiments. In accordance with some embodiments, the second conductive layer 214 comprises TiN. The second conductive layer 214 may be deposited using any suitable technique, such as CVD, ALD, PECVD, PEALD, or PVD, or the like, or a combination thereof. The formation of the second conductive layer 214 may suffer from ball defects. The prevention of ball defects by using $N_2$/He/Ne as the backside gas 400, blown onto the backside of the semiconductor structure 100 through an array of outlets such as the ones shown in FIGS. 8a, 8b, 8c, and 8d has an unexpected result. For example, by using a different backside gas 400 such as $N_2$/He/Ne, the arcing rate may be reduced from about 1.5% to about 0.1% compared to if argon is used as the backside gas. The pressure of the backside gas 400 may be controlled between about 0.2 torr to about 10 torr during the formation of the second conductive layer 214. The temperature of the backside gas 400 line may be controlled between about 20° C. and about 200° C. during the formation of the second conductive layer 214. The different backside gases 400 of $N_2$/He/Ne may be used with different models of wafer stages or heaters 330, such as minimum contact area (MCA), electrostatic chucks (ESC) or other heater machines. The temperature of the wafer stage or heater 330 may be controlled between about 200° C. and about 450° C. during the formation of the second conductive layer 214. The resulting film stress of the second conductive layer 214 may be controlled to be between a compressive stress and a tensile stress. The first conductive layer 212 and the second conductive layer 214 together form a BE layer 210. In some embodiments, the BE layer 210 may include either more or less than two conductive layers, and may use other conductive materials (e.g., Cu, Al, Ta, W, Ti, or the like).

Experiment results revealed that whether ball defects are generated or not is related to the material of the deposited layer. For example, TaN has a lower possibility of having ball defects generated than TiN. Accordingly, in the embodiments in which the first conductive layer 212 is formed of TaN and the second conductive layer 214 is formed of TiN, the first conductive layer 212 may or may not suffer from the ball defects, while the second conductive layer 214 may suffer from the ball defects. Depending on whether the ball defects will be generated, in the deposition of the first conductive layer 212 (FIG. 6), the corresponding backside gas 400 blown to the backside of the wafer may or may not include argon, and the backside gas 400 may include Ar, $N_2$, Ne, He, or combinations thereof. On the other hand, since the formation of the second conductive layer 214 suffers from the ball defects, the respective backside gas 400 is free from argon, and may be performed using a process comprising $N_2$, Ne, He, or combinations thereof. In addition, the backside gas 400 for forming the first conductive layer 212 may be the same as or different from the backside gas 400 used for forming the second conductive layer 214.

Figure 10:
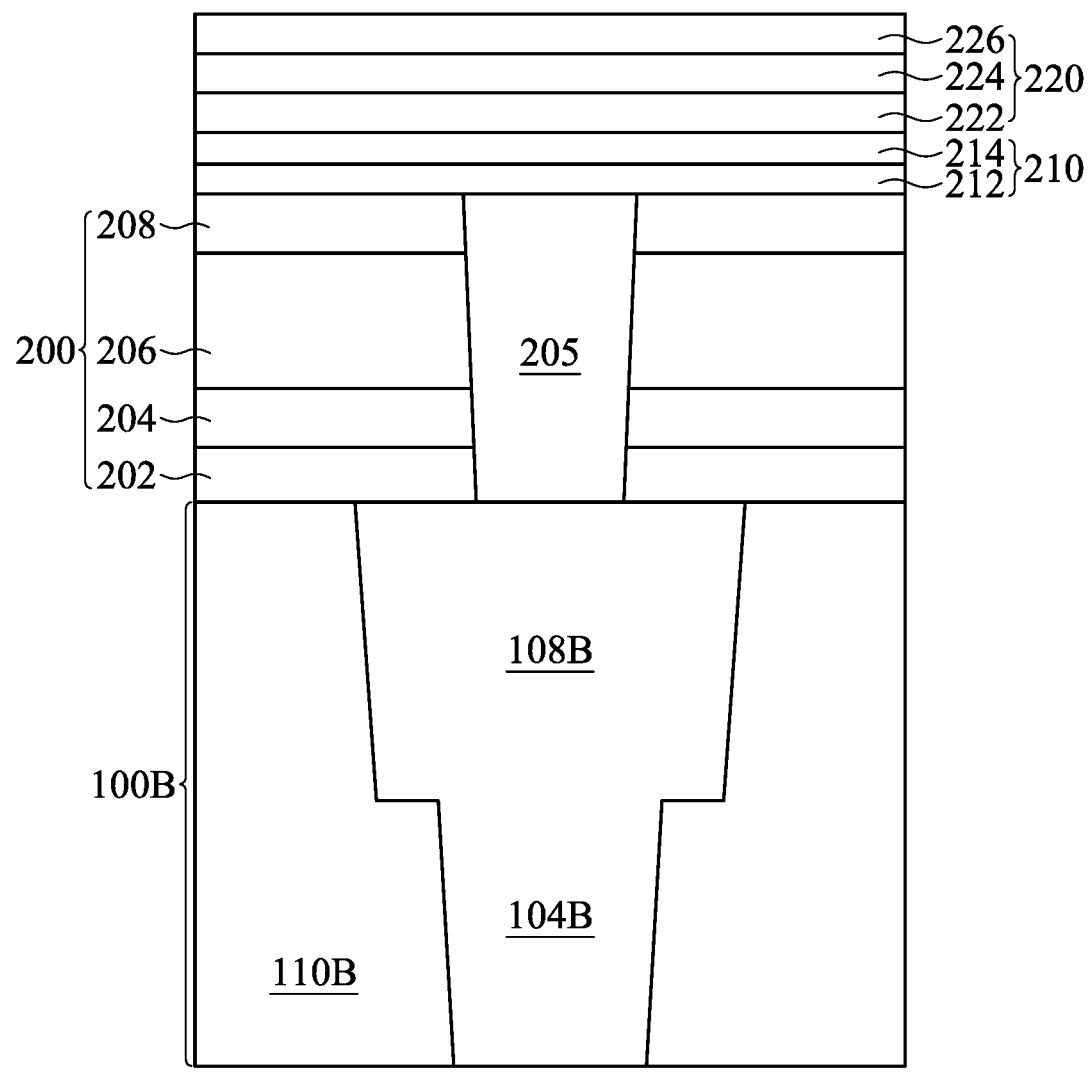

In FIG. 10, a magnetic tunnel junction (MTJ) comprising a plurality of conductive and dielectric layers, collectively referred to as MTJ layer 220, is formed over the BE layer 210. The multilayered MTJ layer may include various layers formed of different combinations of materials. In an example embodiment, MTJ layer 220 includes a pinning layer 222, a tunnel barrier layer 224, and a free layer 226, formed successively. In an example embodiment, the pinning layer 222 is formed of PtMn, the tunnel barrier layer 224 is formed of MgO over the pinning layer 222, and a free layer 226 is formed of $Co_xFe_yB_{1-x-y}$ alloy over the MgO tunnel barrier layer 224. In some embodiments, MTJ layer 220 may use other materials, such as, alloys of Mn with a metal other than Pt (e.g., IrMn, RhMn, NiMn, PdPtMn, or FeMn) to form a pinning layer 222, other dielectrics (e.g., $AlO_x$) to form a tunnel barrier layer 224, and $Fe_yB_{1-x}$ alloy to form the free layer 226. In addition, MTJ layer 220 may have other variations including other layers, such as anti-ferromagnetic layers (e.g., a multilayered $[Co/Pt]_n$ synthetic anti-ferromagnetic (SyAF) layer, etc.). The materials for the MTJ layer 220 may be deposited using one or more techniques, such as, CVD, PECVD, PVD, ALD, or PEALD, or the like, or a combination thereof. In some embodiments, the tunnel barrier layer 224 may be formed by depositing a metal and then oxidizing the metal to convert the metal to a dielectric using, for example, a plasma oxidation technique. It should be recognized that the MTJ layer 220 may have many variations, which are also within the scope of the present disclosure.

FIG. 10 further illustrates how ball defects on the second conductive layer 214 were prevented by the usage of $N_2$/He/Ne as a backside gas as blown onto the backside of semiconductor structure 100 through an array of outlets such as the ones shown in FIGS. 9a, 9b, and 9c, so that the MTJ layer 220 is not deformed by the ball defects. The prevention of the pattern distortion of the MTJ layer 220 reduces the chances of device failure.

Figure 11:
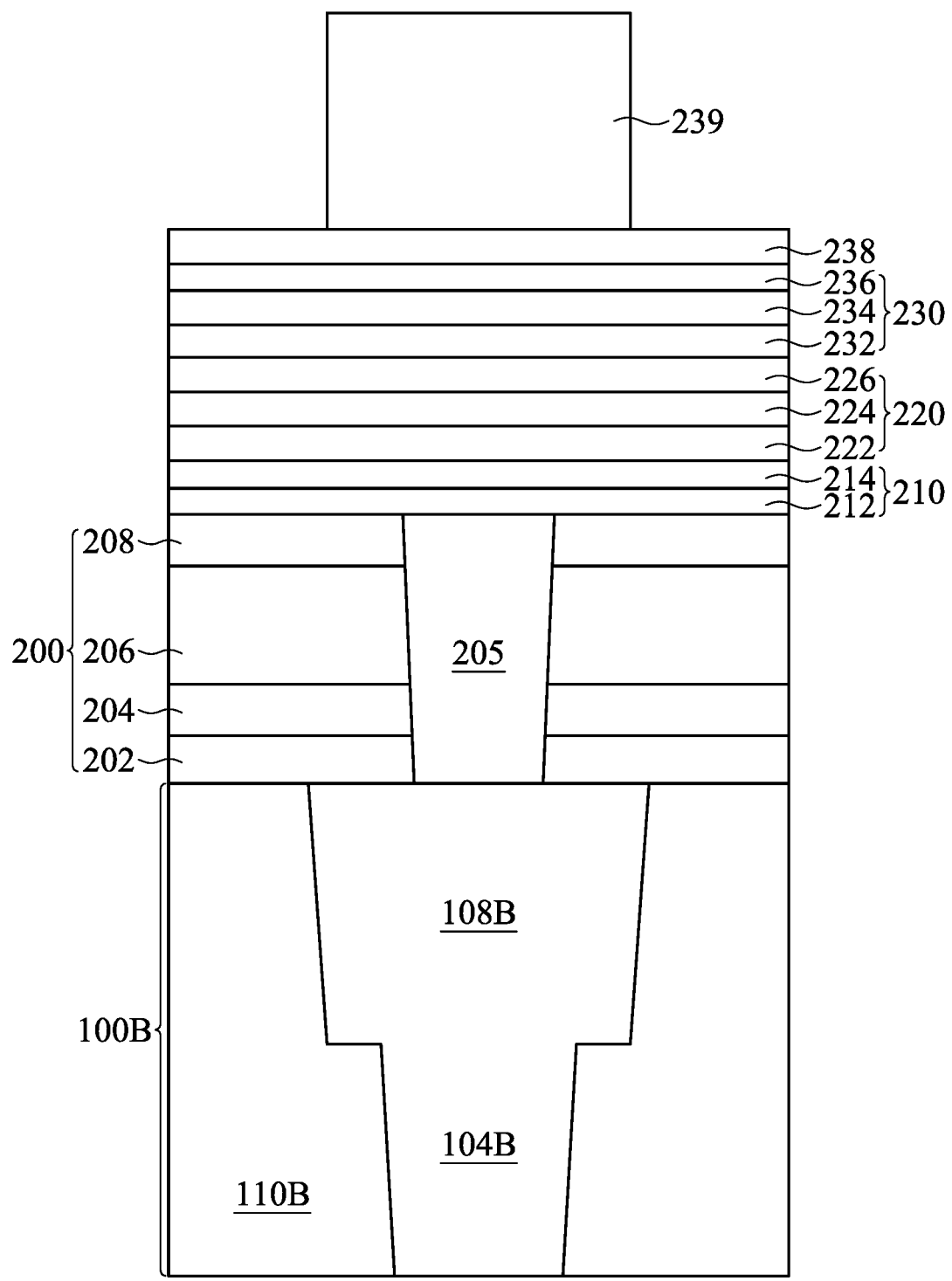

FIG. 11 illustrates a top electrode (TE) layer 230 comprising several conductive layers formed over MTJ layer 220. The multilayered MTJ layer 220 in FIG. 11 is vertically interposed between the BE layer 210 and the TE layer 230, and both physically and electrically in contact with the BE layer 210 and TE layer 230 at their respective interfaces. FIG. 11 also illustrates a hard mask layer 238 deposited on top of the TE layer 230, and a photoresist layer 239 coated and patterned over the hard mask layer 238 using acceptable photolithography techniques.

Still referring to FIG. 11, the TE layer 230 may be formed over the multilayered MTJ layer 220. The bottom conductive surface of the TE layer 230 is shown physically and electrically in contact with the top conductive free layer 226 of the MTJ layer 220. The example TE layer 230 in FIG. 11 comprises three conductive material layers: a first conductive layer 232 comprising TiN, a second conductive layer 234 comprising Ta, and a third conductive layer 236 comprising TaN formed sequentially, in accordance with some embodiments. In other embodiments, the TE layer 230 may include a different number of conductive layers, and may use other conductive materials (e.g., Cu, Al, W, Ti, or the like). The hard mask layer 238, illustrated in FIG. 11, may comprise a dielectric material, in accordance with some embodiments. For example, the hard mask layer 238 may be silicon carbide (SiC), silicon oxynitride (SiON), silicon nitride (SiN), silicon dioxide (SiO$_2$), the like, and/or a combination thereof. The conductive layers 232, 234, 236, and the hard mask layer 238 may be deposited using any suitable technique, such as CVD, PECVD, ALD, PEALD, or PVD, or the like, or a combination thereof.

Figure 12:
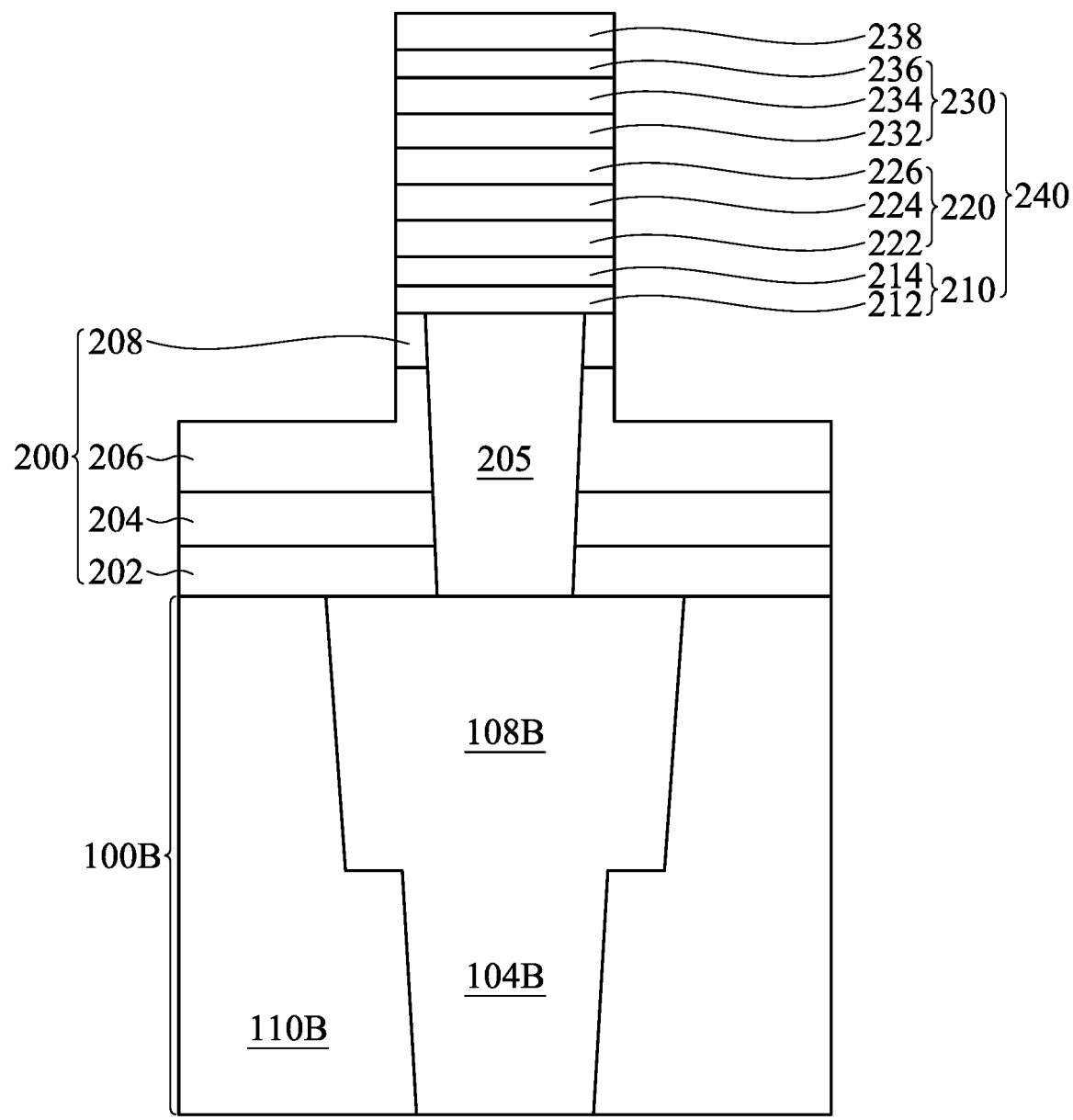

Referring now to FIG. 12, a suitable anisotropic etch (e.g., RIE) may be used to pattern the hard mask layer 238 using the patterned photoresist layer 239 (shown in FIG. 11) as an etch mask, and that pattern may be transferred to form the TE 230, the MTJ 220, and the BE 210 as illustrated in FIG. 12 using the patterned hard mask layer 238 as an etch mask. In addition, the etch process may remove the ARC 208 from the regions unprotected by the patterned hard mask layer 238 and recess the third dielectric layer 206 of the dielectric stack 200. Any remaining photoresist material may be removed by performing a surface clean process (e.g., an ashing process using oxygen plasma).

Figure 13:
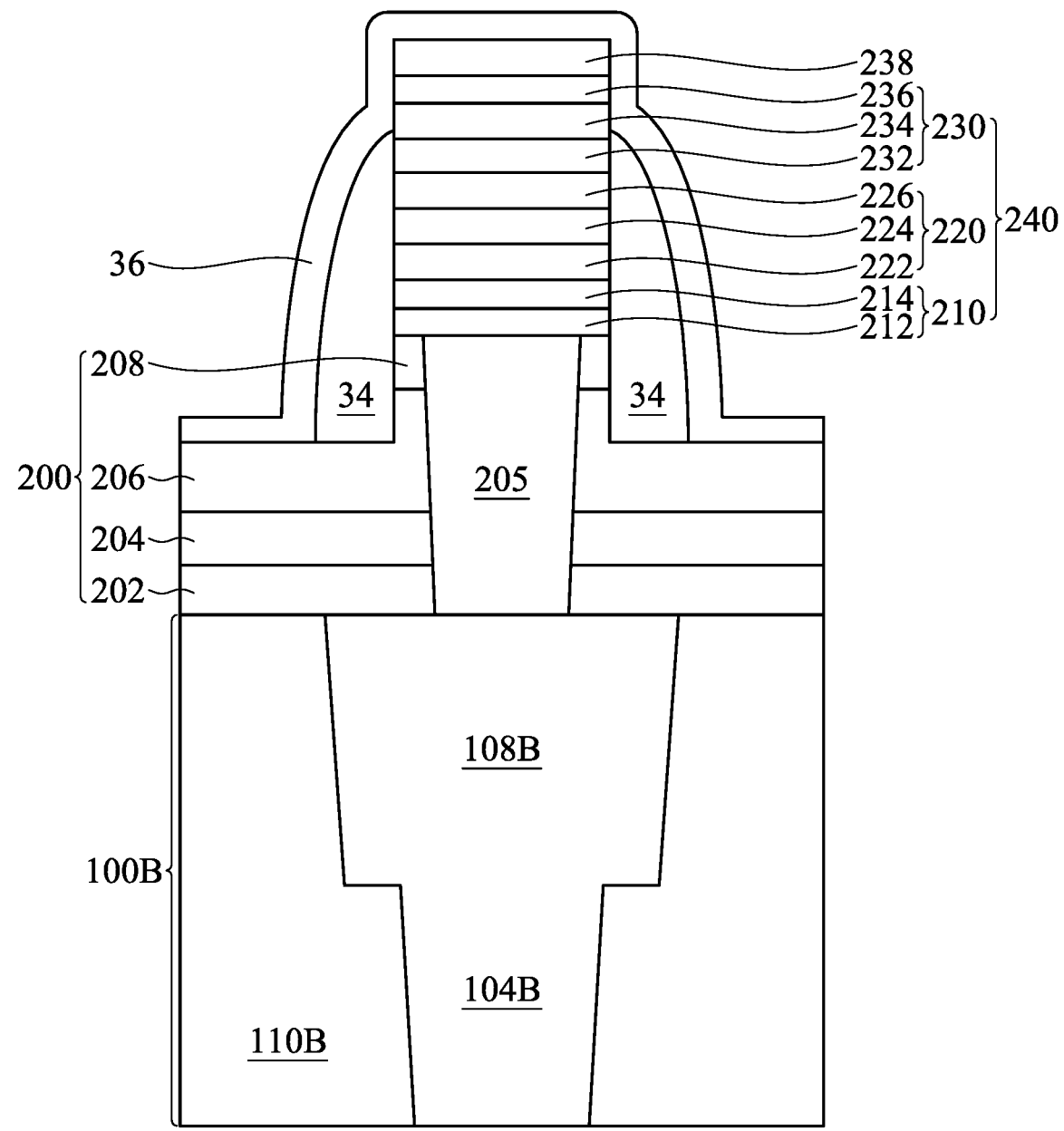

In FIG. 13, dielectric spacers 34 are shown on the vertical sidewalls of the structure illustrated in FIG. 12 supported from below by the recessed horizontal surface of the third dielectric layer 206 of the dielectric stack 200. The dielectric material used in dielectric spacers 34 may be silicon oxide, silicon nitride, or another suitable dielectric deposited by acceptable deposition techniques, such as CVD, PECVD, ALD, PEALD, PVD, the like, and/or a combination thereof, and etched an appropriate anisotropic etching technique (e.g., RIE). In some embodiments, the etching process may form the dielectric spacers 34 recessed at the top thereby exposing the sides of the hard mask cover 238 and a portion of the TE 230. FIG. 13 also illustrates a protective dielectric cover layer 36 formed over the surface, in accordance with some embodiments. The protective dielectric cover layer 36 may be formed using dielectric materials similar to those used to form spacers 34. In some embodiments, the protective dielectric cover layer 36 may have a thickness from about 10 Å to about 3000 Å. The BE 210, the TE 230, and the MTJ 220 are collectively referred to as an MRAM cell 240.

Figure 14:
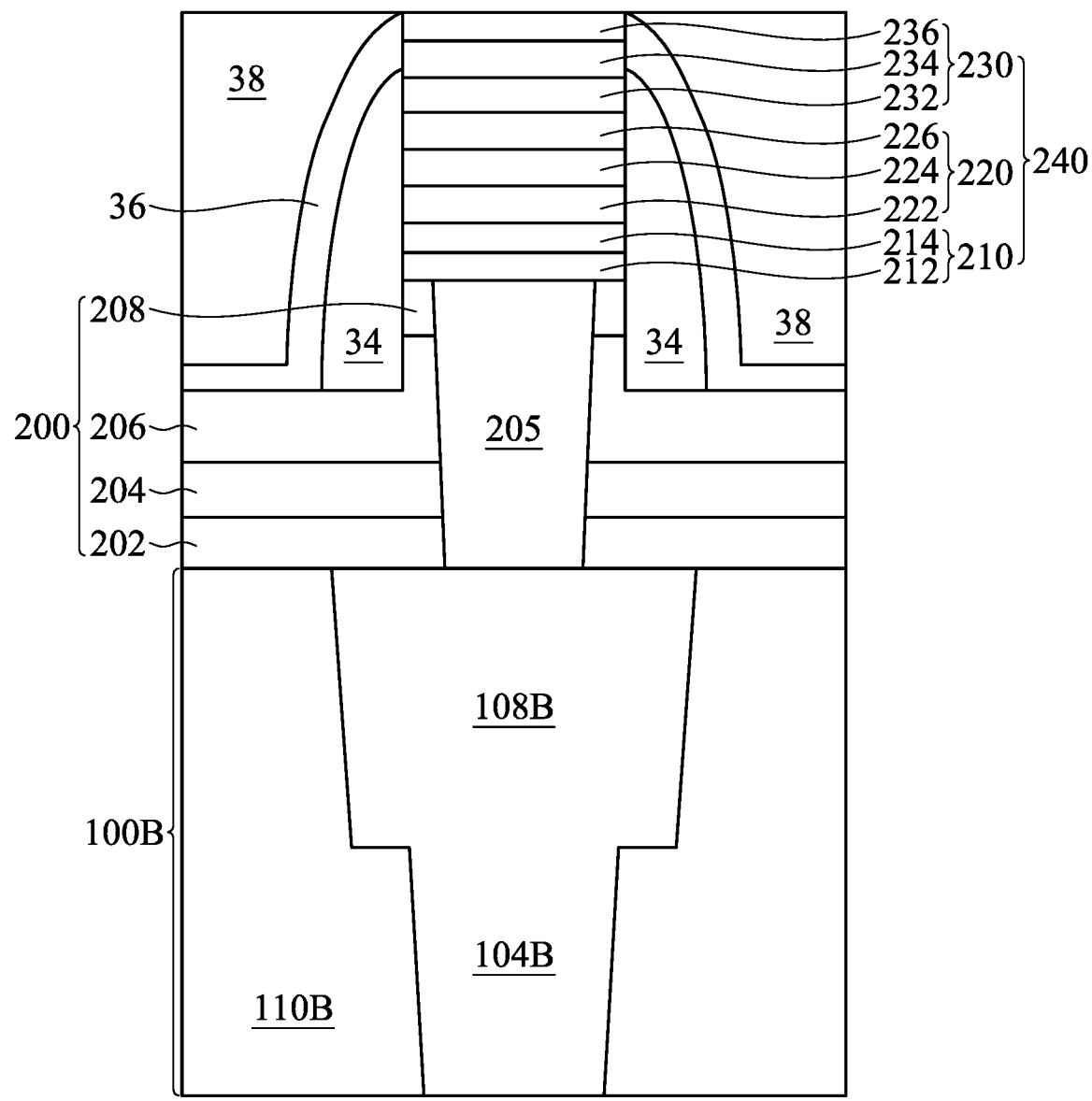

FIG. 14 illustrates a MRAM fill layer 38 formed adjacent to the MRAM cell 240 and filling the space in between memory cells. The MRAM fill layer 38 may be formed by depositing a dielectric material over the protective dielectric cover layer 36 and performing a suitable planarizing process (e.g., CMP) to remove excess materials. In some embodiments, the planarizing process removes all dielectric materials present over the TE 230, including a portion of protective dielectric cover layer 36 and the remaining the hard mask 238 covering the TE 230. The planarizing process may be completed once a top conductive surface of the topmost conductive layer 236 of TE 230 is exposed. As illustrated in FIG. 10, after the planarizing process, a top surface is formed having a dielectric portion substantially coplanar with a conductive portion. The MRAM fill layer 38 may use a suitable dielectric material, such as, SiO$_2$, SiON, PSG, BSG, BPSG, USG, or a low-k dielectric (e.g., PSG, BSG, BPSG, USG, FSG, SiOCH, CDO, flowable oxide, or porous oxides (e.g., xerogels/aerogels), or the like, or a combination thereof. The dielectric MRAM fill layer 38 may be formed using any suitable method, such as CVD, PVD, ALD, PECVD, HDP-CVD, SACVD, FCVD, spin-on, and/or the like, or a combination thereof.

Figure 15:
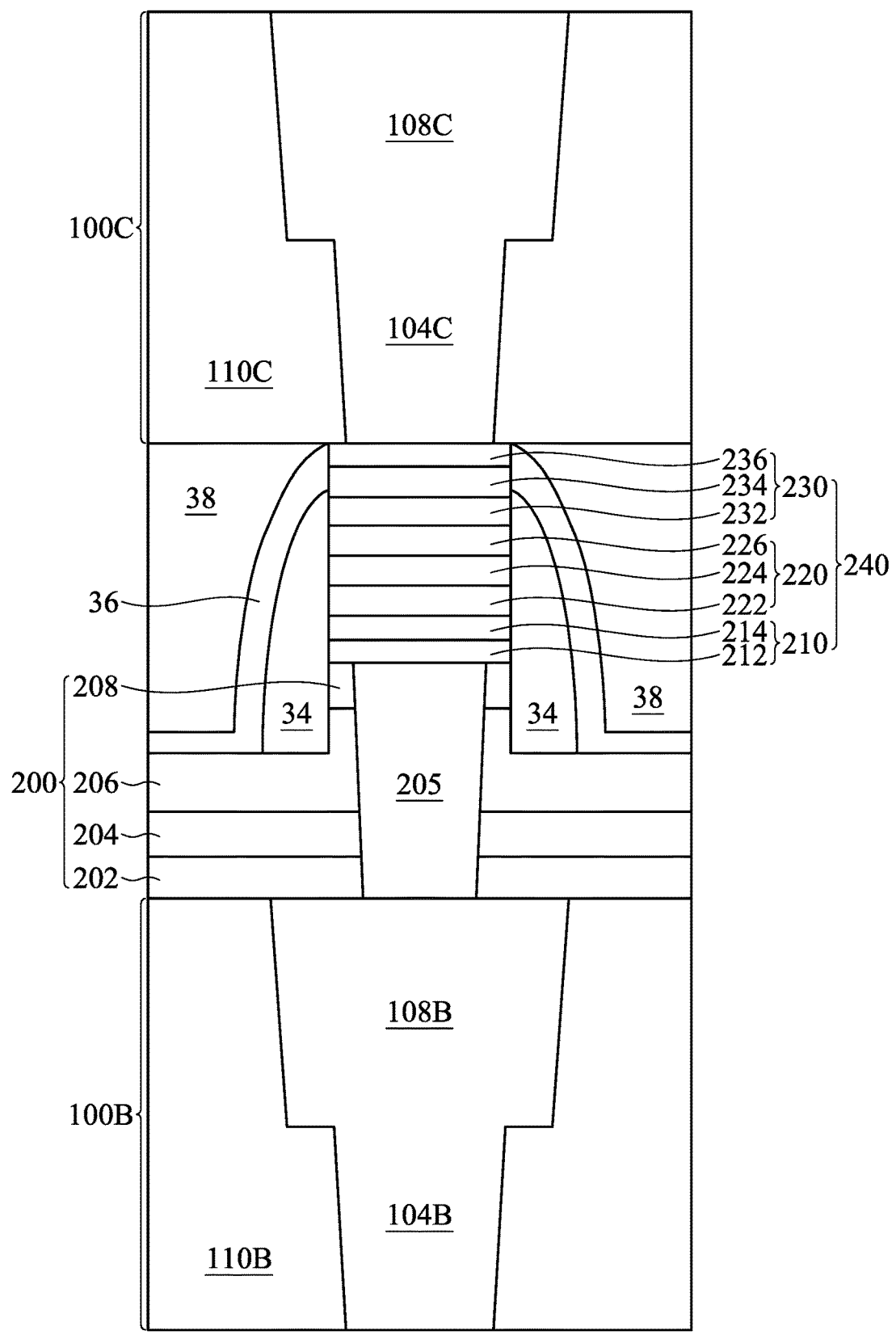

FIG. 15 illustrates a cross-sectional view of the first interconnect level positioned above the MRAM array. In FIG. 15, this level has been specified as the 3$^{rd}$ interconnect level 100C. In this example, interconnect level 100C may be formed using the same materials and methods that were described to form the lower interconnect level 100B. The 3$^{rd}$ interconnect level 100C is shown for illustrative purposes only; it is understood that different interconnect levels may be formed using the same materials and methods as the interconnect levels 100B and 100C. In FIG. 15, a via 104C and a line 108C are shown embedded in an insulating film IMD 110c. The via 104C may be used to make electrical connection to the top conductive surface of TE 230.

Digital data may be stored in an MTJ memory cell based on the magneto-resistive effect described below. In the embodiments described in this disclosure, the magnetic materials used to form the free layer 226 and the pinned layer 222 have a magnetic moment that may be polarized vertically. The MTJ is programmed electrically by forcing the direction of polarization to be either up or down by utilizing the spin torque transfer (STT) effect. During programming, the magnetic moment of the free layer 226 is adjusted to be either parallel or anti-parallel to the magnetic moment of the pinned layer 222 by appropriately biasing the top electrode 230 and the bottom electrode 210. The parallel configuration corresponds to a high probability for quantum mechanical tunneling of electrons through the tunnel barrier layer 224, while the anti-parallel configuration corresponds to a low tunneling probability. The information stored as the parallel or anti-parallel state is sensed during a read operation by sensing the magnitude of current flowing vertically through the tunnel barrier layer 224 when a cell is probed with a relatively small electrical voltage applied between the top electrode 230 and the bottom electrode 210. A response of a high electrical current (low resistance) indicates a parallel state while a low electrical current (high resistance) indicates an anti-parallel state.

The embodiments of the present disclosure have some advantageous features. By using gases such as N$_2$, He, and/or Ne to blow onto the back surfaces of wafers in PVD or CVD processes, electrical arcing caused by high-voltage breakdown of the process gases, which may occur at the wafer edge regions, may be reduced and/or prevented. The reduction or prevention of electrical arcing has the benefit of preventing the generation of undesirable ball defects on the top surfaces of the wafers. These ball defects may lead to pattern deformation in the semiconductor structure or device failure. Using alternative backside gases such as N$_2$, He, and/or Ne can avoid the production of the ball defects and the resulting device failure due to the distortion of the device structure formed on top of the ball defects.

In accordance with some embodiments, a method comprises placing a wafer on a wafer holder; depositing a film on a front surface of the wafer; and blowing a gas through ports in a redistributor onto a back surface of the wafer at a same time the deposition is performed, wherein the gas is selected from a group consisting of nitrogen (N$_2$), He, Ne, and combinations thereof. In an embodiment, the redistributor separates a space on a backside of the wafer into a first portion and a second portion, wherein the gas is blown into the first portion, and is redistributed into the second portion through the ports, with the back surface of the wafer exposed to the second portion. In an embodiment, the ports are arranged in a grid pattern. In an embodiment, the ports are arranged in a cross pattern. In an embodiment, the ports comprise a circular shape. In an embodiment, the ports comprise a rectangular shape. In an embodiment, the ports are distributed so that a first total number of ports along an x-axis is between 1 and 1000, and a second total number of ports along a y-axis is between 1 and 1000. In an embodiment, a distance between nearest adjacent ports is between about 1 mm and about 100 mm.

In accordance with some embodiments, a method comprises depositing a first metal-containing layer on a wafer, wherein a first backside gas is blown to a backside of the wafer when the first metal-containing layer is deposited; and depositing a second metal-containing layer over the first metal-containing layer, wherein a second backside gas is blown to the backside of the wafer when the second metal-containing layer is deposited, and wherein the first backside gas is different from the second backside gas. In an embodiment, the first backside gas comprises argon. In an embodiment, the second backside gas is free from argon. In an embodiment, the second backside gas comprises nitrogen. In an embodiment, the first backside gas is free from nitrogen.

In accordance with some embodiments, a method comprises forming a bottom electrode layer on a substrate, wherein the forming the bottom electrode layer comprises a physical vapor deposition, which comprises sputtering a metal from a target, wherein in the sputtering, plasma is generated from a first gas; and conducting a second gas onto a back surface of the substrate, wherein the second gas is selected from a group consisting of nitrogen ($N_2$), He, Ne, and combinations thereof; forming a magnetic tunnel junction (MTJ) layer over the bottom electrode layer; forming a top electrode layer over the MTJ layer; and patterning the top electrode layer, the MTJ layer, and the bottom electrode layer to form a magnetic random access memory (MRAM) cell. In an embodiment, the first gas comprises nitrogen. In an embodiment, the first gas is free from argon. In an embodiment, a DC power used to generate plasma from the process gas is in a range from about 1 KW to about 30 KW. In an embodiment, the sputtering comprises an arcing rate of about 0.1%. In an embodiment, the bottom electrode layer comprises a first and second sublayer. In an embodiment, the second sublayer is formed over the first sublayer, wherein the first sublayer comprises TaN, wherein the second sublayer comprises TiN.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
placing a wafer on a wafer holder;
depositing a film on a front surface of the wafer; and
blowing a backside gas through ports in a redistributor onto a back surface of the wafer at a same time the deposition is performed, wherein the backside gas is selected from a group consisting of nitrogen ($N_2$), He, Ne, and combinations thereof, wherein the redistributor separates a space on a backside of the wafer into a first portion and a second portion, wherein the backside gas is blown into the first portion, wherein the backside gas is redistributed from the first portion into the second portion through the ports, with the back surface of the wafer exposed to the second portion, wherein a width of the wafer is smaller than a width of the second portion, wherein the backside gas is the only gas in the first portion and the second portion while blowing the backside gas through the ports.

2. The method of claim 1, wherein the ports are arranged in a grid pattern.

3. The method of claim 1, wherein the ports are arranged in a cross pattern.

4. The method of claim 1, wherein the ports comprise a circular shape.

5. The method of claim 1, wherein the ports comprise a rectangular shape.

6. The method of claim 1, wherein the ports are distributed so that a first total number of ports along an x-axis is between 1 and 1000, and a second total number of ports along a y-axis is between 1 and 1000.

7. The method of claim 1, wherein a distance between nearest adjacent ports is between about 1 mm and about 100 mm.

8. A method comprising:
depositing a first metal-containing layer on a wafer by a first physical vapor deposition with a first plasma, wherein a first backside gas is blown to a backside of the wafer when the first metal-containing layer is deposited, wherein the first metal-containing layer comprises TaN, wherein the first backside gas comprises argon or $H_2$; and
depositing a second metal-containing layer over the first metal-containing layer by a second physical vapor deposition with a second plasma, wherein the second metal-containing layer comprises TiN, wherein a second backside gas is blown to the backside of the wafer when the second metal-containing layer is deposited, and wherein the first backside gas is different from the second backside gas, wherein the backside of the wafer is free from exposure to argon and $H_2$ while the second backside gas is blown.

9. The method of claim 8, wherein the first backside gas comprises argon.

10. The method of claim 8, wherein the second backside gas comprises nitrogen.

11. The method of claim 10, wherein the first backside gas is free from nitrogen.

12. A method comprising:
forming a bottom electrode layer on a substrate, wherein the bottom electrode layer comprises a first sublayer and a second sublayer, wherein forming the second sublayer of the bottom electrode layer comprises a first physical vapor deposition comprising:
sputtering a Ti metal from a first target, wherein in the sputtering, plasma is generated from a first gas, wherein the first gas comprises $N_2$; and
conducting a second gas onto a back surface of the substrate, wherein the second gas is selected from a group consisting of nitrogen ($N_2$), He, Ne, and combinations thereof;
forming a magnetic tunnel junction (MTJ) layer over the bottom electrode layer;
forming a top electrode layer over the MTJ layer; and
patterning the top electrode layer, the MTJ layer, and the bottom electrode layer to form a magnetic random access memory (MRAM) cell, wherein the top electrode layer comprises a first conductive layer comprising TiN, a second conductive layer comprising Ta, and a third conductive layer comprising TaN.

13. The method of claim 12, wherein the first gas is free from argon.

14. The method of claim 12, wherein a DC power used to generate the plasma from the first gas is in a range from about 1 KW to about 30 KW.

15. The method of claim 12, wherein an arcing rate of the sputtering with conducting the second gas onto the back surface of the substrate is 0.067 times an arcing rate of the sputtering with conducting argon to the back surface of the substrate.

16. The method of claim 12, wherein the second sublayer is formed over the first sublayer, wherein the first sublayer comprises TaN, wherein the second sublayer comprises TiN.

17. The method of claim 1, wherein the backside gas is blown into the first portion from a gas inlet, and the gas inlet is completely offset from all of the ports in the redistributor in a plan view.

18. The method of claim 8, further comprising heating the wafer and the second backside gas to a range between 200° C. and about 450° C. when depositing the second metal-containing layer.

19. The method of claim 16, wherein the first sublayer of the bottom electrode layer is formed by a second physical vapor deposition comprising:
sputtering a Ta metal from a second target; and
conducting a third gas onto the back surface of the substrate, wherein the third gas comprises argon or $H_2$.

20. The method of claim 12, wherein the first conductive layer of the top electrode layer is formed by a deposition using a plasma, wherein the deposition comprises conducting a fourth gas onto the back surface of the substrate, wherein the fourth gas comprises argon or $H_2$.

* * * * *